(12) United States Patent
Kuroda (10) Patent No.: US 7,709,869 B2
(45) Date of Patent: May 4, 2010

(54) PHOTOELECTRIC CONVERSION DEVICE, METHOD OF MANUFACTURING THE SAME, AND IMAGE SENSING SYSTEM

(75) Inventor: Yukihiro Kuroda, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 18 days.

(21) Appl. No.: 12/147,728

(22) Filed: Jun. 27, 2008

(65) Prior Publication Data

US 2009/0008684 A1 Jan. 8, 2009

(30) Foreign Application Priority Data

Jul. 2, 2007 (JP) .............................. 2007-174569

(51) Int. Cl.
*H01L 31/062* (2006.01)
(52) U.S. Cl. ............... 257/291; 257/292; 257/257; 257/E27.001
(58) Field of Classification Search ............... 257/257, 257/258, 291, 292, E27.001
See application file for complete search history.

(56) References Cited

U.S. PATENT DOCUMENTS

| | | | |
|---|---|---|---|
| 6,661,459 B1 | 12/2003 | Koizumi et al. | 348/310 |
| 6,979,587 B2 | 12/2005 | Lee | 438/57 |
| 7,015,522 B2 | 3/2006 | Miyagawa et al. | 257/292 |
| 7,537,971 B2 * | 5/2009 | Cha | 438/134 |
| 2003/0227039 A1 | 12/2003 | Umeda et al. | 257/291 |
| 2006/0157761 A1 | 7/2006 | Park et al. | 257/293 |
| 2008/0029787 A1 | 2/2008 | Watanabe et al. | 257/233 |

FOREIGN PATENT DOCUMENTS

| | | |
|---|---|---|
| JP | 11-274454 | 10/1999 |
| JP | 2003-188367 A | 7/2003 |
| JP | 2003-258231 A | 9/2003 |
| JP | 2003-289137 A | 10/2003 |
| JP | 2006-203207 A | 8/2005 |
| JP | 2005-310826 A | 11/2005 |

* cited by examiner

*Primary Examiner*—Jack Chen
(74) *Attorney, Agent, or Firm*—Fitzpatrick, Cella, Harper & Scinto (57) ABSTRACT

A photoelectric conversion device comprises a photoelectric conversion unit, a floating diffusion region, a transfer transistor, and an output unit. A control electrode of the transfer transistor includes a first portion which extends along a channel width direction and overlaps a first boundary side when seen through from a direction perpendicular to a light receiving surface of the photoelectric conversion unit, and a second portion which extends along a channel length direction from one end of the first portion and overlaps a second boundary side when seen through from the direction perpendicular to the light receiving surface, and the control electrode of the transfer transistor has an L shape when viewed from the direction perpendicular to the light receiving surface.

6 Claims, 5 Drawing Sheets

PHOTOELECTRIC CONVERSION DEVICE, METHOD OF MANUFACTURING THE SAME, AND IMAGE SENSING SYSTEM

BACKGROUND OF THE INVENTION

1. Field of the Invention

The present invention relates to a photoelectric conversion device, a method of manufacturing the same, and an image sensing system.

2. Description of the Related Art

Recently, digitization of cameras is accelerating, and digital cameras including a photoelectric conversion device for photoelectrically converting an object image formed by an image sensing optical system are now widespread. Typical examples of the photoelectric conversion device are a CCD image sensor and a CMOS image sensor such as APS (Active Pixel Sensor). The CMOS image sensor is expected to have wide applicability because it can select a pixel using an address system and readily achieves system-on-chip.

The CMOS image sensor generally uses a photodiode (buried photodiode) having a carrier accumulation region buried in the substrate to suppress a dark current generated in the surface. In the buried photodiode, however, the carrier accumulation region is arranged in the substrate far apart from its surface. This raises the threshold voltage of a transfer transistor.

Japanese Patent Laid-Open No. 11-274454 discloses a technique of providing, between the carrier accumulation region of a photodiode and the control electrode of a transfer transistor, a region (to be referred to as a "bypass region" hereinafter) of the same conductivity type as the carrier accumulation region and increasing the impurity concentration in a floating diffusion region. According to Japanese Patent Laid-Open No. 11-274454, the depletion layer extends from the floating diffusion region to the bypass region. In this state, the transfer transistor is designed to transfer electric carriers from the carrier accumulation region to the floating diffusion region via the bypass region having a low potential. This supposedly makes it possible to lower the threshold voltage of the transfer transistor.

In the technique disclosed in Japanese Patent Laid-Open No. 2003-258231, the control electrode of a transfer transistor is formed from a main body portion and an expansion portion that is arranged adjacent to a photodiode with respect to the central portion of the main body portion. According to Japanese Patent Laid-Open No. 2003-258231, the expansion portion partially increases, to the photodiode side, the gate length of the central portion of the main body portion of the control electrode of the transfer transistor. This probably allows to read out signal from the carrier accumulation region of the photodiode by complete transfer.

However, the present inventor found the following facts. In the invention of Japanese Patent Laid-Open No. 11-274454, the bypass region is provided between the carrier accumulation region of the photodiode and the region under the control electrode of the transfer transistor. Hence, the distance from the control electrode of the transfer transistor to an end portion of the carrier accumulation region of the photodiode tends to increase. Since the depletion layer hardly extends all over the carrier accumulation region, signal charges may remain at part of the carrier accumulation region.

In the invention of Japanese Patent Laid-Open No. 2003-258231, the expansion portion partially increases the gate length of the central portion of the main body portion of the control electrode of the transfer transistor toward the center of the photodiode. This makes it difficult to photoelectrically convert light that has entered near the center of the photodiode. Since the light amount is large near the center of the photodiode, the sensitivity of the photodiode degrades.

SUMMARY OF THE INVENTION

The present invention provides a photoelectric conversion device capable of suppressing degradation in the sensitivity and obtaining excellent transfer characteristics, a method of manufacturing the same, and an image sensing system.

According to the first aspect of the present invention, there is provided a photoelectric conversion device comprising: a photoelectric conversion unit having a carrier accumulation region; a floating diffusion region which converts electric carriers into a voltage; a transfer transistor which is arranged between the photoelectric conversion unit and the floating diffusion region to transfer the electric carriers accumulated in the carrier accumulation region to the floating diffusion region; and an output unit which outputs a signal corresponding to a voltage of the floating diffusion region, wherein the photoelectric conversion unit further includes a first boundary side which extends along a channel width direction of the transfer transistor and faces the floating diffusion region, and a second boundary side which extends along a channel length direction of the transfer transistor from one end of the first boundary side to the direction away from the floating diffusion region, a control electrode of the transfer transistor includes a first portion which extends along the channel width direction and overlaps the first boundary side when seen through from a direction perpendicular to a light receiving surface of the photoelectric conversion unit, and a second portion which extends along the channel length direction from one end of the first portion and overlaps the second boundary side when seen through from the direction perpendicular to the light receiving surface, and the control electrode of the transfer transistor has an L shape when viewed from the direction perpendicular to the light receiving surface.

According to the second aspect of the present invention, there is provided a photoelectric conversion device comprising: a photoelectric conversion unit having a carrier accumulation region and a protection region of a conductivity type opposite to the carrier accumulation region; a floating diffusion region which converts electric carriers into a voltage; a transfer transistor which is arranged between the photoelectric conversion unit and the floating diffusion region to transfer the electric carriers accumulated in the carrier accumulation region to the floating diffusion region; an output unit which outputs a signal corresponding to a voltage of the floating diffusion region; and a bypass region which has the same conductivity type as the carrier accumulation region and an impurity concentration lower than that of the carrier accumulation region and is arranged under a control electrode of the transfer transistor to be adjacent to the carrier accumulation region and electrically connected to the carrier accumulation region, wherein the photoelectric conversion unit further includes a first boundary side extends along a channel width direction of the transfer transistor and faces the floating diffusion region, and a second boundary side which extends along a channel length direction of the transfer transistor from one end of the first boundary side to the direction away from the floating diffusion region, the control electrode of the transfer transistor includes a first portion which extends along the channel width direction and overlaps the first boundary side when seen through from a direction perpendicular to a light receiving surface of the photoelectric conversion unit, and a second portion which extends along the channel length direction from one end of the first portion and overlaps the second boundary side when seen through from the direction perpendicular to the light receiving surface, the control electrode of the transfer transistor has an L shape when viewed from the direction perpendicular to the light receiving surface, and the bypass region includes a first bypass region which is arranged adjacent to the carrier accumulation region along the first boundary side, and a second bypass region which is arranged adjacent to the carrier accumulation region along the second boundary side.

According to the third aspect of the present invention, there is provided a method of manufacturing a photoelectric conversion device having a semiconductor substrate, comprising the steps of: forming, in the semiconductor substrate, a first semiconductor region of a first conductivity type which has a first boundary side and a second boundary side extending from one end of the first boundary side in a direction different from the first boundary side by implanting an impurity into the semiconductor substrate; forming an electrode on the semiconductor substrate to overlap the first boundary side and the second boundary side when seen through from a direction perpendicular to a surface of the semiconductor substrate; forming, in the semiconductor substrate, a second semiconductor region of the first conductivity type which is arranged adjacent to the first semiconductor region and electrically connected to the first semiconductor region by implanting the impurity into the semiconductor substrate via a region exposed by the electrode in the first semiconductor region; and forming, in the first semiconductor region on a surface side of the semiconductor substrate, a third semiconductor region of a second conductivity type by implanting an impurity into the semiconductor substrate via the region exposed by the electrode in the first semiconductor region.

According to the fourth aspect of the present invention, there is provided an image sensing system comprising the photoelectric conversion device of the first aspect of the present invention, an optical system which forms an image on an imaging plane of the photoelectric conversion device, and a signal processing unit which processes a signal output from the photoelectric conversion device to generate image data.

According to the fifth aspect of the present invention, there is provided an image sensing system comprising the photoelectric conversion device of the second aspect of the present invention, an optical system which forms an image on an imaging plane of the photoelectric conversion device, and a signal processing unit which processes a signal output from the photoelectric conversion device to generate image data.

According to the present invention, it is possible to provide a photoelectric conversion device capable of suppressing degradation in the sensitivity and obtaining excellent transfer characteristics, a method of manufacturing the same, and an image sensing system.

Further features of the present invention will become apparent from the following description of exemplary embodiments with reference to the attached drawings.

DESCRIPTION OF THE EMBODIMENTS

The preferred embodiments of the present invention will now be described in detail with reference to the accompanying drawings. The structures, arrangements, and impurity types of parts to be described below are not intended to limit the scope of the invention.

First Embodiment

Figure 1:
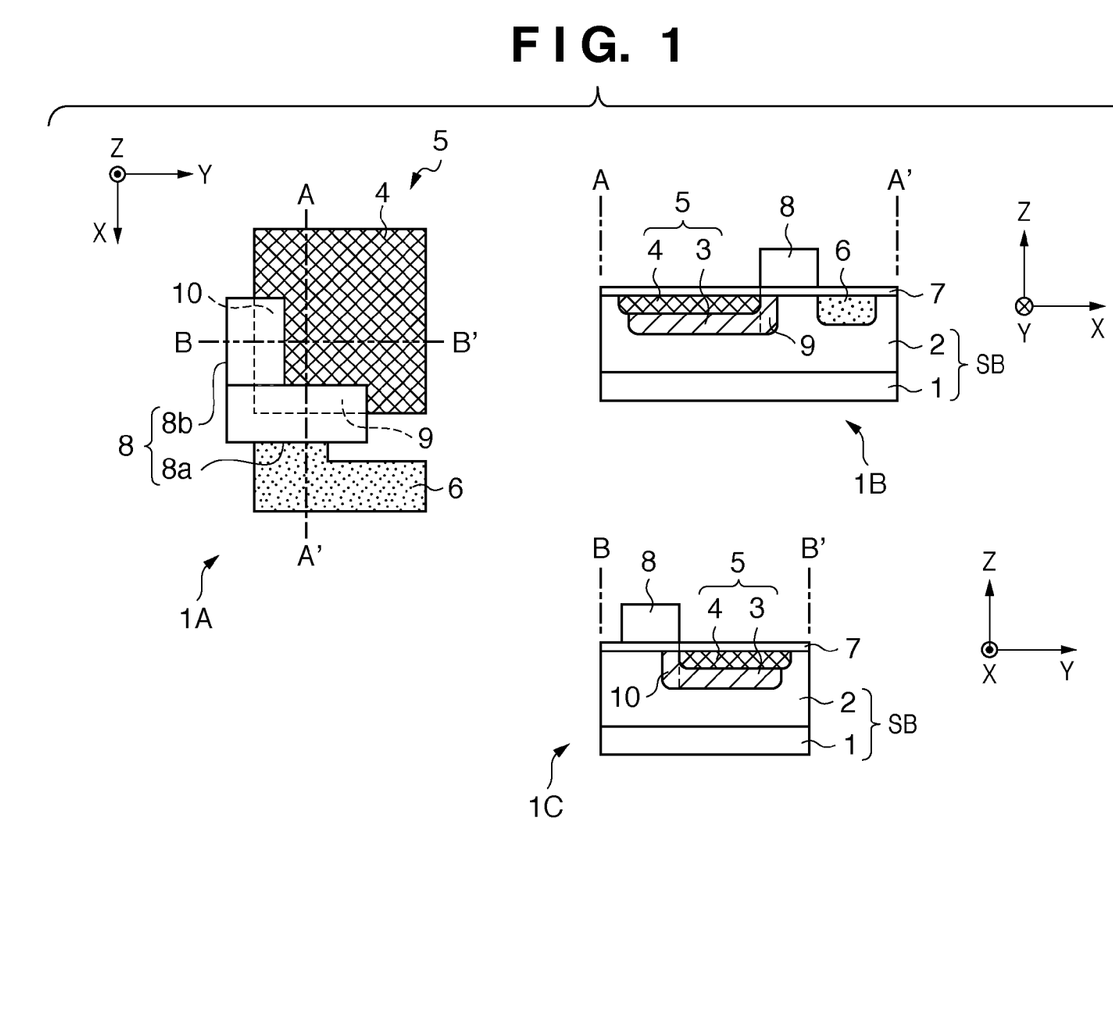
FIG. 1 includes 1A to 1C which are views showing the arrangement of a photoelectric conversion device according to a preferred first embodiment of the present invention.

FIG. 1 includes 1A to 1C which are views showing the arrangement of a photoelectric conversion device according to a preferred first embodiment of the present invention. 1A of FIG. 1 is a view showing the layout of a photodiode 5 serving as a photoelectric conversion unit, a control electrode 8 of a transfer transistor, and a floating diffusion region 6. 1B of FIG. 1 is a sectional view of the photoelectric conversion device taken along a line A-A' in 1A of FIG. 1. 1C of FIG. 1 is a sectional view of the photoelectric conversion device taken along a line B-B' in 1A of FIG. 1.

A p-type well 2 is formed on an n-type region 1 in a semiconductor substrate SB. The n-type region 1 contains an n-type (first conductivity type) impurity. The p-type well 2 contains a p-type (second conductivity type) impurity. An n-type layer 3 functioning as the carrier accumulation region of the photodiode 5 is formed in the p-type well 2. That is, the n-type layer 3 of the photodiode 5 is buried in the semiconductor substrate SB. A p-type layer 4 heavily doped with a p-type impurity of a conductivity type opposite to the n-type layer 3 is formed on the n-type layer 3 of the photodiode 5. The p-type layer 4 functions as a protection region for the n-type layer 3. Since the p-type layer 4 heavily doped with the p-type impurity is formed in the surface of the semiconductor substrate SB, the depletion layer, i.e., the photoelectric conversion region between the n-type layer 3 and the p-type well 2 is spaced apart from the surface of the semiconductor substrate SB. Additionally, the n-type layer 3 for accumulating electric carriers generated by photoelectric conversion is also spaced apart from the surface of the semiconductor substrate SB. This structure suppresses electric carriers derived from a dark current generated in the surface of the semiconductor substrate SB from mixing with those generated by photoelectric conversion. The depletion layer formed near the junction between the p-type well 2 and the n-type layer 3 functions as a photoelectric conversion region that converts light consisting part of an object image into a signal. In this embodiment, the carriers are electrons. The control electrode 8 of the transfer transistor is formed on an insulating layer 7 formed on the photodiode 5.

The control electrode 8 of the transfer transistor has a first portion 8a extending along the channel width direction (Y direction in 1A of FIG. 1). The control electrode 8 further has a second portion 8b extending along the channel length direction (X direction in 1A of FIG. 1). Here, the channel is referred to as a region which is defined by the first portion 8a. When seen through from the direction (Z direction) perpendicular to the light receiving surface of the photodiode 5, the first portion 8a is arranged to overlap a first boundary side 3a (see the right side view of 3A of FIG. 3) parallel to the channel width direction of the transfer transistor. When seen through from the direction (Z direction) perpendicular to the light receiving surface of the photodiode 5, the second portion 8*b* is arranged to overlap a second boundary side 3*b* parallel to the channel length direction of the transfer transistor. The first boundary side 3*a* is one of the sides defining the boundary between the photodiode 5 and other regions. Specifically, the boundary of the photodiode 5 is the boundary between the n-type layer 3 and the p-type well 2. The first boundary side 3*a* extends along the channel width direction of the transfer transistor and faces the floating diffusion region. The second boundary side 3*b* is another one of the sides defining the boundary between the photodiode 5 and other regions. The second boundary side 3*b* extends along the channel length direction of the transfer transistor from one end of the first boundary side 3*a* to the other side of the floating diffusion region 6.

Bypass regions 9 and 10 which continue from the n-type layer 3 of the photodiode 5 are formed between the transfer transistor and the photodiode 5. That is, the photodiode 5 includes the n-type layer 3, p-type layer 4, and bypass regions 9 and 10. The bypass region (first bypass region) 9 is formed along the first boundary side 3*a* to be adjacent to the n-type layer 3 (carrier accumulation region). The bypass region (second bypass region) 10 is connected to the bypass region 9 and formed along the second boundary side 3*b* to be adjacent to the n-type layer 3 (carrier accumulation region). That is, the bypass regions 9 and 10 are formed along the two boundary sides 3*a* and 3*b* of the photodiode 5. The bypass regions 9 and 10 contain an impurity of the same conductivity type as the n-type layer (carrier accumulation region) 3, i.e., an n-type impurity at a concentration lower than that in the n-type layer 3.

The floating diffusion region 6 to which signal is transferred by the transfer transistor is formed in the p-type well 2. The channel of the transfer transistor is mainly formed in the region between the bypass region 9 and the floating diffusion region 6 in the p-type well 2. The channel can also be formed in any other region in the p-type well 2 under the control electrode 8 of the transfer transistor. In this embodiment, however, the channel length direction and the channel width direction are defined based on the channel formed in the region between the bypass region 9 and the floating diffusion region 6 in the p-type well 2, for the descriptive convenience. This also applies to the second embodiment to be described later.

The characteristic features of the present invention will be described next in detail in association with a read operation. When light enters the photodiode 5, the n-type layer 3 of the photodiode 5 accumulates electrons generated by photoelectric conversion. At this time, the transfer transistor is OFF. Before the transfer transistor is turned on, a reset transistor (to be described later) is turned on to reset the floating diffusion region 6 and sweep out all electric carriers remaining in the floating diffusion region 6. After the elapse of a predetermined accumulation period, a positive voltage is applied to the control electrode (gate) 8 of the transfer transistor to turn it on and transfer the signal in the n-type layer 3 of the photodiode 5 to the floating diffusion region 6. The floating diffusion region 6 converts the transferred electric carriers into a voltage. A source follower circuit (to be described later) outputs a signal corresponding to the voltage of the floating diffusion region 6 to a column signal line (to be described later).

If the transfer transistor is sufficiently set ON, a reverse bias with respect to the GND potential of the p-type well 2 and the heavily doped p-type layer 4 of the surface is applied to the n-type layer 3 of the photodiode 5. In this case, the depletion layer extends from the p-type well 2 and the heavily doped p-type layer 4 of the surface to the n-type layer 3 so that the entire n-type layer 3 of the photodiode 5 is depleted. This makes it possible to read out almost all signal accumulated in the photodiode 5 to the floating diffusion region 6.

To implement the above operation, it is necessary to sufficiently set ON the transfer transistor, i.e., almost completely deplete the n-type layer 3 of the photodiode 5. To do this, in this embodiment, the bypass region 9 facing the floating diffusion region 6 is provided, and additionally, the bypass region 10 is provided along the boundary side of the carrier accumulation region different from that on the side of the floating diffusion region 6. This arrangement allows a larger part of the carrier accumulation region to be depleted, as compared to an arrangement with a bypass region provided along only one boundary side of the carrier accumulation region.

Assume that a bypass region is formed along only one boundary side of the carrier accumulation region. In this case, the carrier accumulation region may not be depleted near the boundary sides farthest from the bypass region.

In this embodiment, however, a bypass region is provided not only along a boundary side of the carrier accumulation region but also along another boundary side that extends in a direction different from that of the first boundary side. In this case, even when the depletion layer does not extend from one of the two bypass regions to the carrier accumulation region, it extends from the other bypass region to the carrier accumulation region so that the carrier accumulation region can completely be depleted. In this embodiment, since the bypass regions and the control electrode are formed near the peripheral area of the photodiode, it is possible to avoid any difficulty in photoelectric conversion of light incident near the center of the photodiode. This suppresses degradation in the sensitivity.

Figure 4:
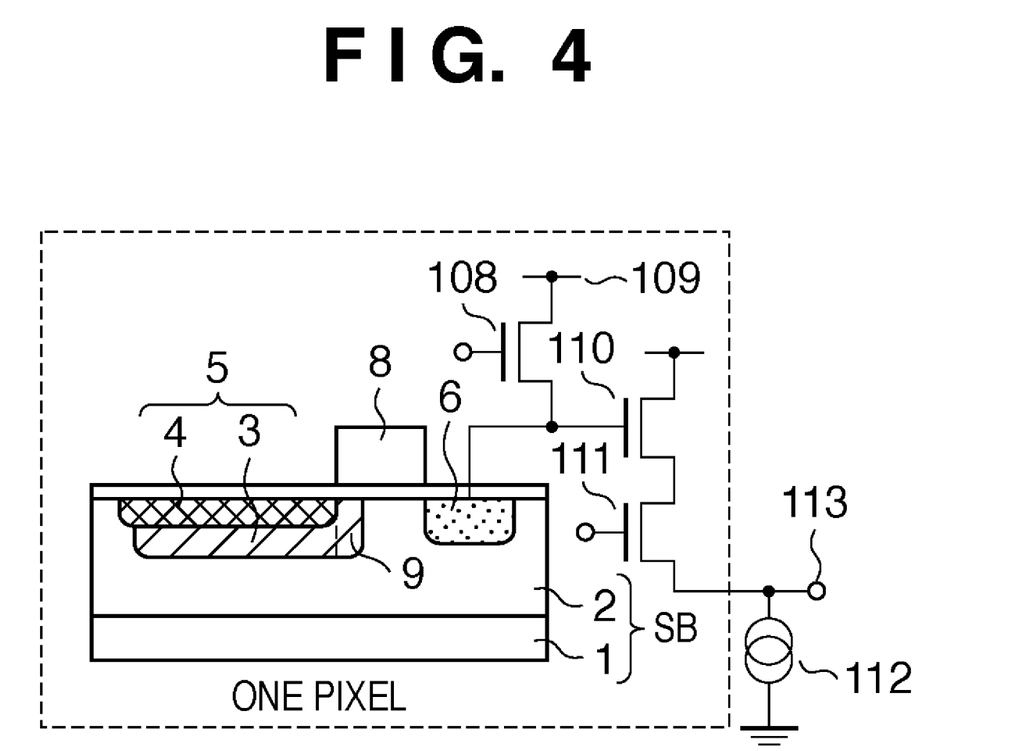
FIG. 4 is a view showing the section of the photoelectric conversion device according to the embodiment and the circuit arrangement around it.

FIG. 4 is a view showing the section of the photoelectric conversion device according to this embodiment and the circuit arrangement around it. The floating diffusion region 6 is formed under a side surface of the control electrode 8 of the transfer transistor. The floating diffusion region 6 is connected to the gate of an amplification MOS transistor (output unit) 110. The impurity concentration of the floating diffusion region 6 is set to be sufficiently high. For this reason, the depletion layer which is generated between the p-type well 2 and the floating diffusion region 6 by the bias applied to the control electrode 8 of the transfer transistor effectively extends to the side of the p-type well 2. It is possible to lower the potential barrier for the electrons near the bypass regions 9 and 10 and easily read out the signal in the n-type layer 3 by appropriately setting the voltage in reading out. The drain of a row selection switching MOS transistor 111 is connected to the source of the amplification MOS transistor 110. A current source 112 serving as the load of the amplification MOS transistor 110 is connected to the source of the row selection switching MOS transistor 111 via a column signal line. When the row selection switching MOS transistor 111 is set ON, the amplification MOS transistor 110 and the current source 112 form a source follower circuit. An output terminal 113 of the source follower circuit is connected to a readout circuit (not shown). When a horizontal scanning circuit (not shown) scans the readout circuit in the column direction, the signal read out from the source follower circuit to the readout circuit is further output outside the circuit. The source of a reset MOS transistor 108 for resetting the floating diffusion region 6 is connected to the floating diffusion region 6. A reset power supply 109 is connected to the drain of the reset MOS transistor 108. FIG. 4 illustrates one pixel in the pixel array of the photoelectric conversion device. Actually, a plurality of pixels having identical structures are arrayed in the row and column directions to form an image sensing plane (pixel array). Known arrangements are applicable to the image sensing plane and its peripheral circuits. The peripheral circuit arrangement shown in FIG. 4 is also applicable to the second embodiment to be described later.

As described above, the bypass region capable of effectively transferring optical signal is provided not only along a boundary side of the photodiode facing the floating diffusion region but also along another boundary side (extending from one end of the boundary side to the direction away from the floating diffusion region) which is different from the boundary side of the photodiode facing the floating diffusion region. The control electrode of the transfer transistor is formed such that the two bypass regions are located under it. This facilitates to completely deplete the carrier accumulation region of the photodiode and provides an effect of helping drawing electrons from the carrier accumulation region. It is therefore possible to satisfactorily read out optical signal.

Additionally, since the control electrode of the transfer transistor is formed along the boundary of the photodiode, it is possible to avoid any difficulty in photoelectric conversion of light incident near the center of the photodiode. This suppresses degradation in the sensitivity. Since the two bypass regions exist under the control electrode of the transfer transistor, it is possible to lower not only the potential under the control electrode but also the potential barrier of the bypass regions for electrons by applying a positive voltage to the control electrode. From this viewpoint as well, an effect of improving the carrier transfer characteristics from the photodiode to the floating diffusion region can be obtained.

Second Embodiment

Figure 2:
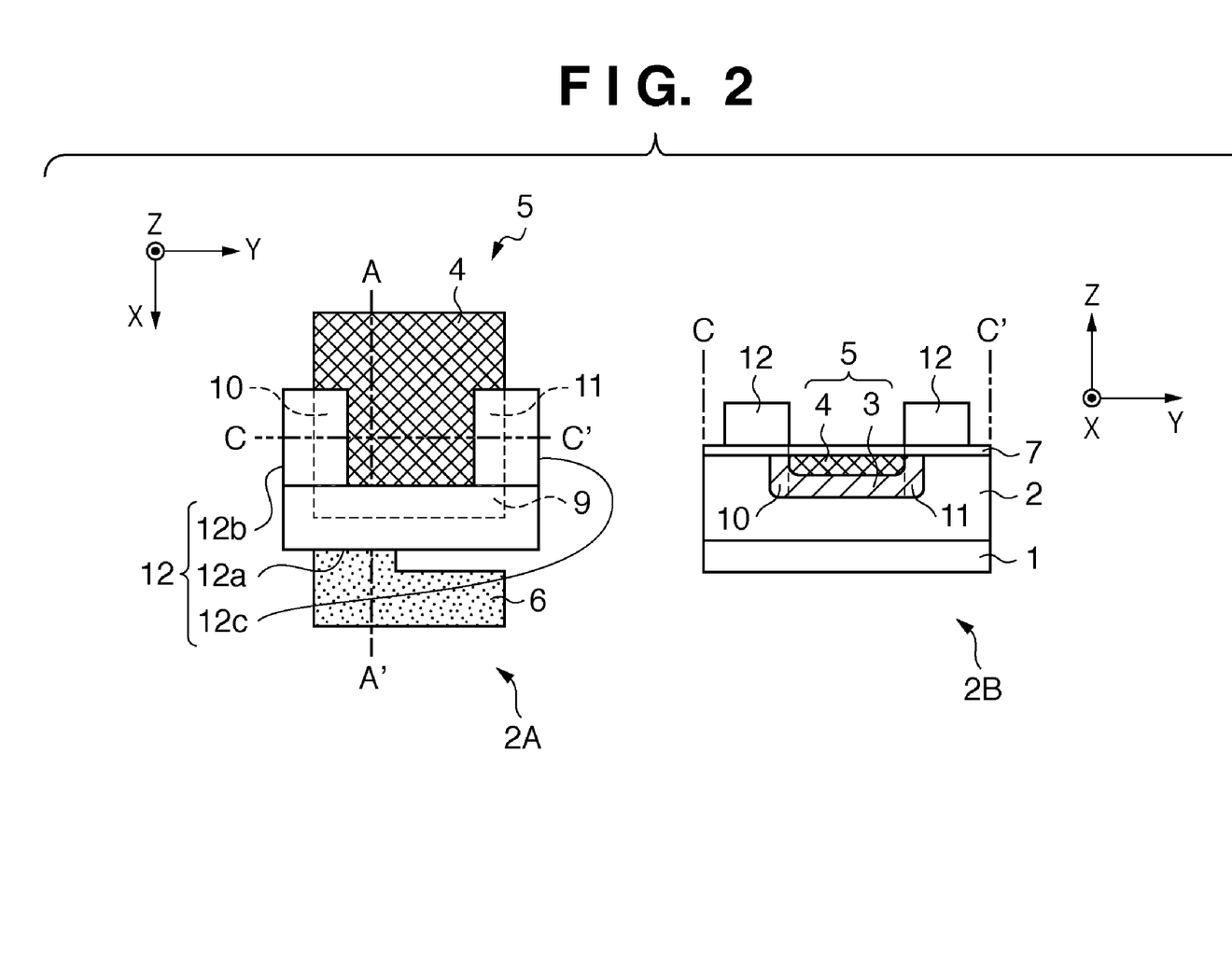
FIG. 2 includes 2A and 2B which are views showing the arrangement of a photoelectric conversion device according to a preferred second embodiment of the present invention.

FIG. 2 includes 2A and 2B which are views showing the arrangement of a photoelectric conversion device according to a preferred second embodiment of the present invention. A description of the same parts as in the first embodiment will not be repeated.

2A of FIG. 2 is a view showing the layout of a photodiode 5, a control electrode 12 of a transfer transistor, and a floating diffusion region 6. 2B of FIG. 2 is a sectional view of the photoelectric conversion device taken along a line C-C' in 2A of FIG. 2. Note that the section of the photoelectric conversion device taken along a line A-A' in 2A of FIG. 2 is the same as in 1B of FIG. 1.

In this embodiment, a bypass region 11 is provided in addition to bypass regions 9 and 10. The bypass region 11 is connected to the bypass region 9 and formed along a third boundary side 3c (see the right side view of 3A of FIG. 3) opposing a second boundary side 3b. More specifically, the bypass region 9 is provided along a boundary side 3a of the photodiode 5 facing the floating diffusion region 6. Additionally, the bypass regions 10 and 11 are provided along the boundary sides 3b and 3c (extending from two ends of the boundary side to the direction away from the floating diffusion region) which are different from the boundary side 3a of the photodiode facing the floating diffusion region. The bypass regions 9, 10, and 11 contain an impurity of the same conductivity type as an n-type layer (carrier accumulation region) 3, i.e., an n-type impurity at a concentration lower than that in the n-type layer 3.

The control electrode 12 of the transfer transistor has a first portion 12a extending along the channel width direction (Y direction in 2A of FIG. 2). The control electrode 12 of the transfer transistor also has a second portion 12b extending along the channel length direction (X direction in 2A of FIG. 2) and a third portion 12c extending along the channel length direction and opposing the second portion 12b. When seen through from the direction (Z direction) perpendicular to the light receiving surface of the photodiode 5, the third portion 12c is arranged to overlap the third boundary side 3c. The control electrode 12 of the transfer transistor is formed such that the bypass regions 9, 10 and 11 are located under it.

This arrangement further facilitates to completely deplete the carrier accumulation region of the photodiode and makes it possible to draw electrons from the carrier accumulation region and satisfactorily read out optical signal.

In this embodiment, the depletion layer easily extends from the three bypass regions formed along the three boundary sides of the carrier accumulation region. This enables to completely deplete the carrier accumulation region even near the corners between the boundary sides farthest from the bypass regions.

Additionally, since the bypass regions are provided near the peripheral area of the photodiode, it is possible to avoid any difficulty in photoelectric conversion of light incident near the center of the photodiode. This suppresses degradation in the sensitivity. Since the three bypass regions exist under the control electrode of the transfer transistor, it is possible to lower not only the potential under the control electrode but also the potential barrier of the bypass regions for electrons by applying a positive voltage to the control electrode. From this viewpoint as well, an effect of further improving the carrier transfer characteristics from the photodiode to the floating diffusion region can be obtained.

It should be noted that, although in the above-described first and second embodiments, the carrier accumulation region of the photodiode accumulates electrons (the electric carriers are electrons), the present invention is not limited to this. The idea of the present invention can also be applied to a case in which the carrier accumulation region of the photodiode accumulates holes (electric carriers are holes) by reversing the conductivity type of each element.

(Photoelectric Conversion Device Manufacturing Method)

A method of manufacturing the photoelectric conversion device according to the preferred embodiment of the present invention will be described next with reference to FIG. 3. The right-side views of FIGS. 3A to 3D show the layout of the photoelectric conversion device in the respective steps. The left-side views of FIGS. 3A to 3D show the section of the photoelectric conversion device taken along a line A-A' in the right-side views.

First, a p-type impurity such as boron is ion-implanted in the semiconductor substrate SB, and annealing is performed, thereby forming the p-type well 2. A region of the semiconductor substrate SB where no ions are implanted is the n-type region 1. A photoresist 30 is applied to the surface of the semiconductor substrate SB. An n-type layer (first semiconductor region of the first conductivity type) 3i of the photodiode is formed using the photoresist 30 as a mask (3A of FIG. 3).

After the photoresist 30 is removed, the insulating layer 7 such as a gate oxide film is formed on the entire surface of the semiconductor substrate SB by thermal oxidation. The control electrode 8 of the transfer transistor is formed on it by patterning. The control electrode 8 of the transfer transistor has an L shape when viewed from the direction perpendicular to the surface of the semiconductor substrate SB.

It should be noted that, in this step, the control electrode 8 may overlap the n-type layer 3i when seen through from a direction perpendicular to the surface of the semiconductor substrate SB. In this case, the overlapped region has an L shape when viewed from the direction perpendicular to the surface of the semiconductor substrate SB.

After gate electrode formation, an n-type layer 3j may be formed using the gate electrode as a mask. This simplifies the process and reduces misalignment and the like.

Figure 3:
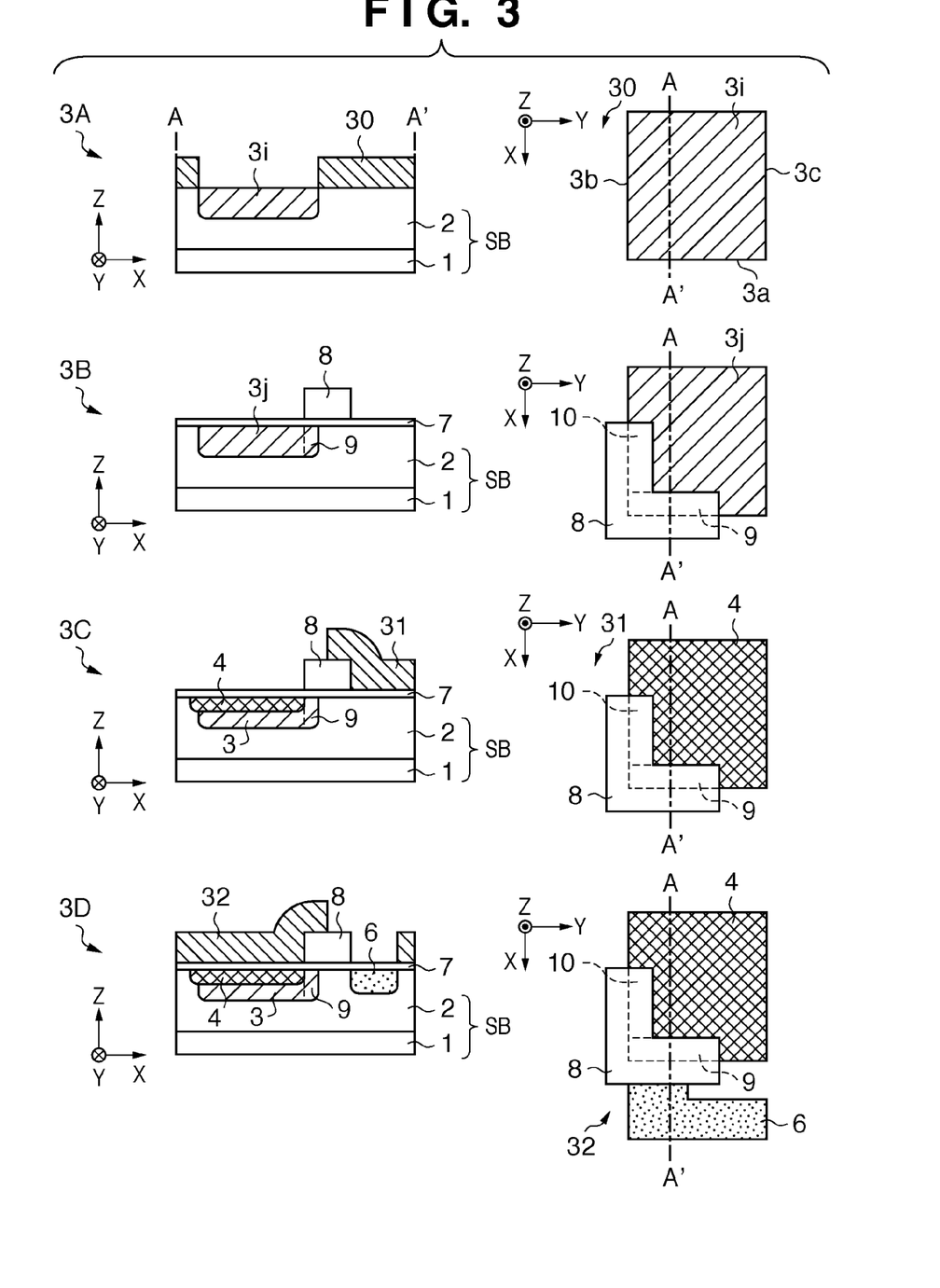
FIG. 3 includes 3A to 3D which are views showing a method of manufacturing the photoelectric conversion device according to the preferred embodiment of the present invention.

An n-type impurity is ion-implanted into the surface of the semiconductor substrate SB using the control electrode 8 as a mask, thereby forming the n-type layer 3j heavily doped with the n-type impurity and the bypass regions 9 and 10 (second semiconductor region of the first conductivity type) lightly doped with the n-type impurity (3B of FIG. 3). The bypass regions 9 and 10 have an L shape when viewed from the direction perpendicular to the surface of the semiconductor substrate SB. The ion implantation angle of the bypass regions 9 and 10 lightly doped with the n-type impurity is set to be larger than that of the n-type layer 3j heavily doped with the n-type impurity. The ion implantation angle is the tilt from the normal to the surface of the semiconductor substrate. The bypass regions 9 and 10 can be formed with good controllability under the control electrode 8 by implanting ions at these angles using the control electrode 8 as a mask. The bypass regions affect the transfer efficiency and are therefore desirably formed with good controllability. The n-type layer 3j heavily doped with the n-type impurity indicates a region overlapping the n-type layer (first semiconductor region of the first conductivity type) 3i in forming the bypass regions. The overlap region can be changed depending on the ion implantation conditions.

A photoresist 31 is formed on the n-type layer 3 of the photodiode in the surface of the semiconductor substrate SB and a part of the control electrode 8 of the transfer transistor. Annealing is performed in a nitrogen atmosphere. Then, a p-type impurity is ion-implanted into the surface of the semiconductor substrate SB using the control electrode 8 as a mask, thereby forming the p-type layer (protection region) 4 heavily doped with the p-type impurity and the n-type layer (carrier accumulation region) 3 (3C of FIG. 3).

After the photoresist 31 is removed, a photoresist 32 is formed on a part of the control electrode 8 of the transfer transistor and the remaining regions of the surface of the semiconductor substrate SB. Annealing is performed in a nitrogen atmosphere. Then, an n-type impurity such as arsenic is ion-implanted at a high concentration using the control electrode 8 and the photoresist 32 as a mask, thereby forming the floating diffusion region 6 (3D of FIG. 3).

In this way, the carrier accumulation region 3 serving as the source region of the transfer transistor and the floating diffusion region 6 serving as the drain region of the transfer transistor are formed on both sides of the control electrode 8 of the transfer transistor.

After that, for example, the first interlayer dielectric film, contact, first metal interconnection, second interlayer dielectric film, via interconnection to connect the first and second metal interconnections, second metal interconnection, and passivation film are sequentially formed in accordance with the normal semiconductor manufacturing process.

With the above-described process, a photoelectric conversion device having a bypass region on each of at least two adjacent boundary sides of a photodiode is manufactured.

It should be noted that, although a method of manufacturing a layout pattern shown in 1A of FIG. 1 has been exemplified above, the method is also applicable to manufacture the layout pattern shown in 2A of FIG. 2 by changing the pattern of the control electrode 8 to be formed in 3B of FIG. 3. In addition, a step in which the control electrode 8 is formed and a step in which the n-type layer 3i are performed in reverse order. In this case, the n-type layer 3i is formed using the already formed control electrode as a mask.

(Image Sensing System)

Figure 5:
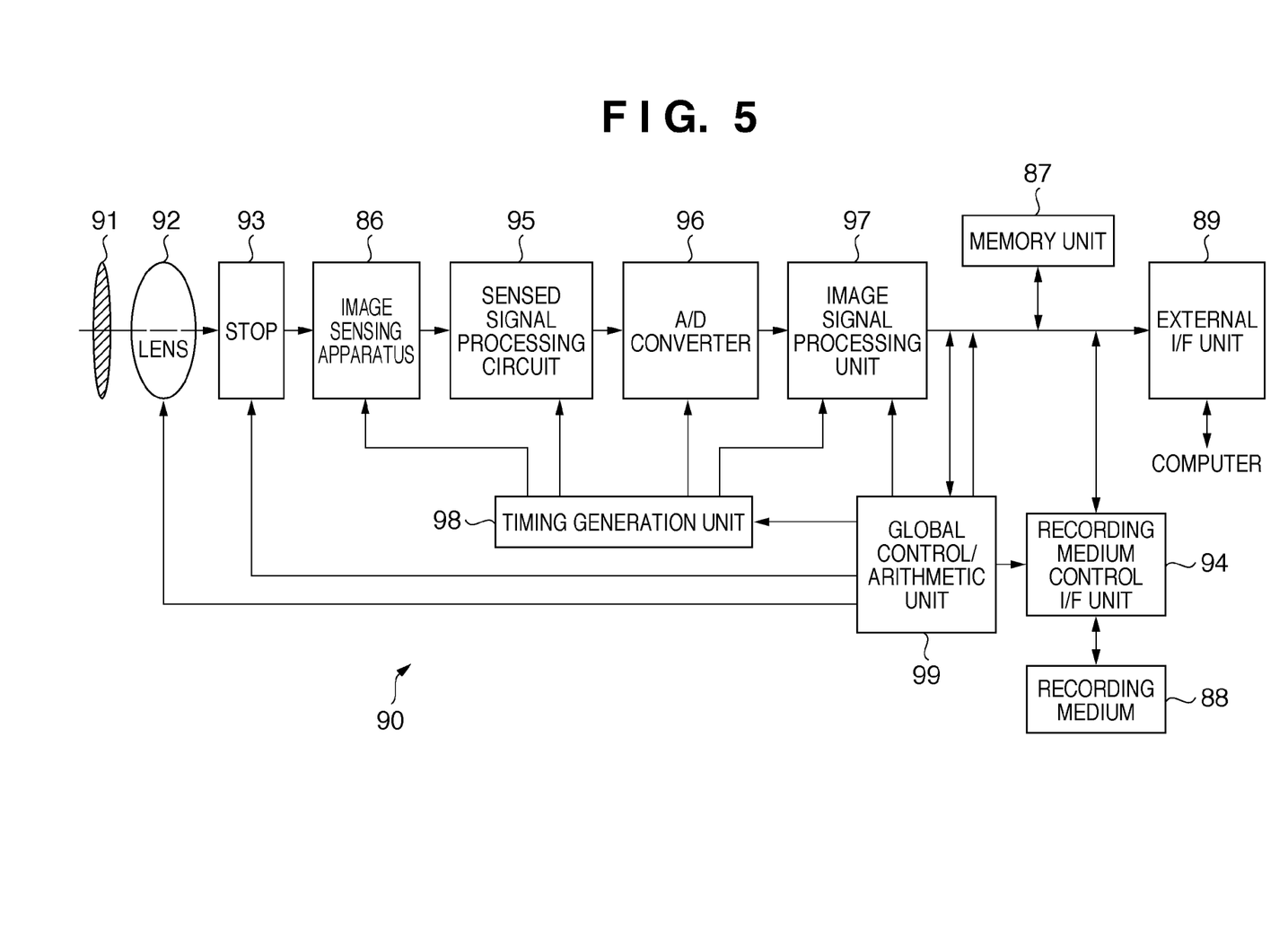
FIG. 5 is a block diagram showing an example of an image sensing system to which the photoelectric conversion device of the preferred embodiment of the present invention is applied.

FIG. 5 shows an example of an image sensing system to which the photoelectric conversion device of the present invention is applied.

As shown in FIG. 5, an image sensing system 90 mainly includes an optical system, image sensing apparatus 86, and signal processing unit. The optical system mainly includes a shutter 91, taking lens 92, and stop 93. The image sensing apparatus 86 includes a photoelectric conversion device according to a preferred embodiment of the present invention. The signal processing unit mainly includes an sensed signal processing circuit 95, A/D converter 96, image signal processing unit 97, memory unit 87, external I/F unit 89, timing generation unit 98, global control/arithmetic unit 99, recording medium 88, and recording medium control I/F unit 94. The signal processing unit need not always include the recording medium 88.

The shutter 91 is located in front of the taking lens 92 on the optical path to control exposure.

The taking lens 92 refracts incident light and forms an object image on the imaging plane of the image sensing apparatus 86.

The stop 93 is provided on the optical path between the taking lens 92 and the photoelectric conversion device according to the preferred embodiment of the present invention to adjust the amount of light which passes through the taking lens 92 and is guided to the photoelectric conversion device according to the preferred embodiment of the present invention.

The photoelectric conversion device according to the preferred embodiment of the present invention converts the object image formed on the imaging plane into an image signal. The image sensing apparatus 86 reads out the image signal from the photoelectric conversion device and outputs it.

The sensed signal processing circuit 95 is connected to the image sensing apparatus 86 to process the image signal output from the image sensing apparatus 86.

The A/D converter 96 is connected to the sensed signal processing circuit 95 to convert the processed image signal (analog signal) output from the image sensing signal processing circuit 95 into an image signal (digital signal).

The image signal processing unit 97 is connected to the A/D converter 96 to execute arithmetic processes such as various kinds of correction for the image signal (digital signal) output from the A/D converter 96, thereby generating image data. The image data is supplied to the memory unit 87, external I/F unit 89, global control/arithmetic unit 99, and recording medium control I/F unit 94.

The memory unit 87 is connected to the image signal processing unit 97 to store the image data output from the image signal processing unit 97.

The external I/F unit 89 is connected to the image signal processing unit 97 so that the image data output from the image signal processing unit 97 is transferred to an external device (e.g., personal computer) via the external I/F unit 89.

The timing generation unit 98 is connected to the image sensing apparatus 86, sensed signal processing circuit 95, A/D converter 96, and image signal processing unit 97 to supply a timing signal to them. The image sensing apparatus 86, sensed signal processing circuit 95, A/D converter 96, and image signal processing unit 97 operate in synchronism with the timing signal.

The global control/arithmetic unit 99 is connected to the timing generation unit 98, image signal processing unit 97, and recording medium control I/F unit 94 to comprehensively control them.

The recording medium 88 is detachably connected to the recording medium control I/F unit 94. The image data output from the image signal processing unit 97 is recorded on the recording medium 88 via the recording medium control I/F unit 94.

In the above embodiment, the n-type layer 3 which has a first boundary side in the channel width direction and a second boundary side in the channel length direction has been described as an example. However, the effect of the arrangement of the present invention can be obtained even when the first and second boundary sides do not make a right angle. For example, the n-type layer 3 may have a triangle shape whose first and second boundary sides intersect at 60°.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-174569, filed Jul. 2, 2007, which is hereby incorporated by reference herein in its entirety.

What is claimed is:

1. A photoelectric conversion device comprising:
a photoelectric conversion unit having a carrier accumulation region;
a floating diffusion region which converts electric carriers into a voltage;
a control electrode which consists part of a transfer transistor and is arranged between the photoelectric conversion unit and the floating diffusion region to transfer the electric carriers accumulated in the carrier accumulation region to the floating diffusion region; and
an output unit which outputs a signal corresponding to a voltage of the floating diffusion region,
wherein the photoelectric conversion unit includes
a first boundary side which extends along a channel width direction of the transfer transistor and faces the floating diffusion region, and
a second boundary side which extends along a channel length direction of the transfer transistor from one end of the first boundary side to the direction away from the floating diffusion region,
the control electrode of the transfer transistor includes
a first portion which extends along the channel width direction and overlaps the first boundary side when seen through from a direction perpendicular to a light receiving surface of the photoelectric conversion unit, and
a second portion which extends along the channel length direction from one end of the first portion and overlaps the second boundary side when seen through from the direction perpendicular to the light receiving surface, and
the control electrode of the transfer transistor has an L shape when viewed from the direction perpendicular to the light receiving surface.

2. The device according to claim 1, wherein
the photoelectric conversion unit further comprises a protection region which has a conductivity type opposite to the carrier accumulation region and is arranged between the light receiving surface and the carrier accumulation region.

3. The device according to claim 1, further comprising
a bypass region which has the same conductivity type as the carrier accumulation region and is arranged under the control electrode of the transfer transistor to be adjacent to the carrier accumulation region and electrically connected to the carrier accumulation region,
the bypass region including
a first bypass region which is arranged adjacent to the carrier accumulation region along the first boundary side, and
a second bypass region which is arranged adjacent to the carrier accumulation region along the second boundary side.

4. The device according to claim 3, wherein
the bypass region has an L shape when viewed from the direction perpendicular to the light receiving surface.

5. The device according to claim 3, wherein
an impurity concentration of the bypass region is lower than that of the carrier accumulation region.

6. A photoelectric conversion device comprising:
a photoelectric conversion unit having a carrier accumulation region;
a floating diffusion region which converts electric carriers into a voltage;
a control electrode which consists part of a transfer transistor and is arranged between the photoelectric conversion unit and the floating diffusion region to transfer the electric carriers accumulated in the carrier accumulation region to the floating diffusion region; and
an output unit which outputs a signal corresponding to a voltage of the floating diffusion region,
wherein the photoelectric conversion unit includes
a first boundary side which extends along a first direction, and
a second boundary side which extends along a second direction,
the control electrode has an L shape when viewed from the direction perpendicular to a light receiving surface,
the first boundary side and the second boundary side at least partially has a overlapped region which is overlapped by the control electrode when seen through from the direction perpendicular to the light receiving surface and which has an L shape when viewed from the direction perpendicular to the light receiving surface.

* * * * *